(12) United States Patent
Besson et al.

(10) Patent No.: US 7,815,977 B2
(45) Date of Patent: Oct. 19, 2010

(54) PROCESS FOR DEPOSITING A THIN LAYER AND PRODUCT OBTAINED THEREBY

(75) Inventors: Sophie Besson, Paris (FR); Maxime Duran, Cavanac (FR); Emmanuel Garre, Le Vésinet (FR); Carole Gentilhomme, Aulnay-sous-Bois (FR); Emilie Viasnoff, Sèvres (FR); Corinne Victor, Saint-Leu la Forêt (FR); Thierry Gay, Cluny (FR)

(73) Assignee: CertainTeed Corporation, Valley Forge, PA (US)

( * ) Notice: Subject to any disclaimer, the term of this patent is extended or adjusted under 35 U.S.C. 154(b) by 218 days.

(21) Appl. No.: 11/923,137

(22) Filed: Oct. 24, 2007

(65) Prior Publication Data
US 2008/0131616 A1 Jun. 5, 2008

(30) Foreign Application Priority Data
Nov. 2, 2006 (FR) .................................. 06 54699

(51) Int. Cl.
*C08F 2/46* (2006.01)
(52) U.S. Cl. ................... 427/488; 427/489; 428/432; 428/698; 428/701; 428/702; 502/242; 204/192.1
(58) Field of Classification Search ................ 427/488, 427/489; 428/702, 701, 698, 432; 204/192.1; 502/242
See application file for complete search history.

(56) References Cited

U.S. PATENT DOCUMENTS

| 4,378,408 | A | | 3/1983 | Joedicke |
| 5,411,803 | A | | 5/1995 | George et al. |
| 5,558,843 | A | * | 9/1996 | Glocker et al. ......... 422/186.05 |
| 6,106,659 | A | * | 8/2000 | Spence et al. .......... 156/345.43 |
| 6,426,309 | B1 | | 7/2002 | Miller et al. |
| 6,531,200 | B2 | | 3/2003 | Zickell et al. |
| 7,294,404 | B2 | | 11/2007 | Krisko et al. |
| 7,387,839 | B2 | | 6/2008 | Gueneau et al. |
| 2003/0068469 | A1 | | 4/2003 | Aschenbeck et al. |
| 2005/0053745 | A1 | | 3/2005 | Bartek et al. |
| 2005/0053746 | A1 | | 3/2005 | Bartek |
| 2005/0197248 | A1 | | 9/2005 | Ohtsu et al. |
| 2006/0014050 | A1 | * | 1/2006 | Gueneau et al. ............. 428/702 |
| 2007/0092734 | A1 | | 4/2007 | Durandeau et al. |
| 2008/0107820 | A1 | * | 5/2008 | Gabelnick et al. ........... 427/489 |
| 2009/0075067 | A1 | | 3/2009 | Myli et al. |
| 2009/0075069 | A1 | | 3/2009 | Myli et al. |

FOREIGN PATENT DOCUMENTS

| FR | 2670506 | 12/1990 |
| FR | 2857030 | 7/2003 |
| WO | 03087002 A1 | 10/2003 |
| WO | 2006049865 A1 | 5/2006 |

OTHER PUBLICATIONS

Abstract of FR2670506 (English) (1992).

* cited by examiner

*Primary Examiner*—Lan Vinh
*Assistant Examiner*—Maki A Angadi
(74) *Attorney, Agent, or Firm*—Paul & Paul

(57) ABSTRACT

The purpose of the invention is a process for obtaining a material comprising a substrate at least part of whose surface and at least one of whose faces is based on organic compounds, the said process being implemented at atmospheric pressure comprises moreover the following stages. In the immediate vicinity of the said substrate a zone containing active species of a non-thermal plasma is created; into the said zone is injected at least one precursor of a chemical element so as to deposit upon at least one face of the said substrate (at least part of whose surface comprises an organic compound base), a first thin layer capable of protecting the said substrate against oxidation reactions, specifically those due to radicals. A further purpose of the invention is the material obtainable according to this process.

21 Claims, No Drawings

PROCESS FOR DEPOSITING A THIN LAYER AND PRODUCT OBTAINED THEREBY

CROSS REFERENCE TO RELATED APPLICATION

This application claims the priority of French Patent Application No. 0654699 filed Nov. 2, 2006.

BACKGROUND OF THE INVENTION

1. Field of the Invention

The invention relates to the domain of materials demonstrating self-cleaning properties and/or ease of cleaning. It specifically concerns architectural materials comprising a substrate at least partially organic, such as PVC, polyethylene, polypropylene, painted wood or painted aluminum, coated with at least with one thin layer able to protect the said substrate against oxidation reactions via radicals, as well as the process by which such materials may be obtained.

Some materials, specifically those used in architecture, are generally subjected to dust and atmospheric pollution, and suffer deterioration of their surface appearance with the passage of time. In order to avoid excessively frequent and costly cleaning, some materials which possess self-cleaning properties and/or which are easy to clean, have been developed. Some of these make use of the photocatalytic and photo-induced superhydrophilic properties of titanium dioxide ($TiO_2$), being coated with one or several layers comprising this oxide. The latter, in particular when crystallized in the anatase form, has the ability, when irradiated with ultraviolet light (from the sun, for example), to become superhydrophilic and to catalyze radical reactions leading to degradation of organic dirt: these two properties are independent. Specifically, the former property prevents the formation of droplets of water which leave stains due to mineral deposits when they dry, and in fact encourages wetting of the surface by rain water and the consequent removal of dirt. The material thus obtained therefore presents the ability to self-clean under the action of sunlight and rain water. Patent application EP-A-0 850 204 describes this type of application for glass windows.

In the case of architectural materials whose surfaces comprise organic compounds such as polyvinyl chloride (PVC), polyethylene, polypropylene, painted wood or painted aluminum, it is not possible to deposit a photocatalytic layer directly onto the material since the photocatalytic coating would degrade these organic compounds under the influence of radical oxidation reactions. It is therefore proposed that mineral barrier layers should be used to protect these materials. Patent application EP-A-1 498 176 describes for example 30 micrometer thick barrier layers based on $SiO_2$, $ZrO_2$ etc., which protect the extrusions of PVC windows from the photocatalytic effects of a $TiO_2$ coating. These barrier layers are obtained at low temperature by a sol-gel type of process, in which the precursors in solution in a solvent (the sol) are deposited onto the substrate; when they gel they form a solid coating on the surface of the said substrate.

BRIEF SUMMARY OF THE INVENTION

It appeared to the inventors that, in the case of a substrate whose surface comprises organic compounds, the barrier layers thus obtained did not display satisfactory adhesion with the layers deposited as above. Such substrates demonstrate at least on their surface an elevated coefficient of thermal expansion, and in particular, higher than that of the inorganic materials used as barrier layers.

When such substrates are used, the barrier layer cannot be reheated since the great difference in the expansion coefficient between the substrate and the mineral barrier layer would give rise to mechanical stresses on cooling, cracking, and thus poor adhesion between the substrate and the barrier layer. In fact, it would seem that (without wishing to invoke any particular scientific theory) the barrier layers obtained by a sol-gel type of process which are not reheated (or are insufficiently reheated), contain a certain amount of solvent which inhibits good adhesion with the layers placed on top of them.

The aim of the invention is thus to obviate these problems, and proposes a deposition process which allows barrier layers demonstrating improved adhesion with the layers deposited onto them to be obtained.

To this end, the purpose of the invention is a process for obtaining a material comprising a substrate at least part of whose surface and at least one of whose faces is based on organic compounds, the said process being implemented at atmospheric pressure and without heating the entire substrate. The said process comprises moreover the following stages:

In the immediate vicinity of the said substrate a zone containing active species of a non-thermal plasma is created.

Into the said zone is injected at least one precursor of a chemical element so as to deposit onto at least one face of the said substrate (at least part of whose surface comprises an organic compound base), a first thin layer capable of protecting the said substrate against oxidation reactions, specifically those due to radicals.

The substrate is preferably chosen to be a substrate of polyvinyl chloride (PVC), polyethylene (PE), polypropylene (PP), painted wood or painted aluminum. Those materials currently used in the architectural domain, specifically for windows, doors and claddings, exhibit a large coefficient of expansion, either intrinsically or at the level of the painted surface (and consequently being based on organic compounds). PVC has the disadvantage that it distorts at temperatures greater than 60° C., and possesses a coefficient of thermal expansion of 40 to $80 \times 10^{-6}$ deg $C.^{-1}$. By comparison, silicon dioxide, currently employed as a barrier layer, has a thermal expansion coefficient of the order of just $3 \times 10^{-6}$ deg $C.^{-1}$.

DETAILED DESCRIPTION OF THE INVENTION

Implementation of the process according to the invention does not involve heating the entire substrate. By that it is understood that no means of heating is used which allows the temperature of the substrate, in its entirety, to exceed 50° C., preferably 40° C. Interaction of active plasma species with the surface of the substrate can, on the other hand, lead to local heating of the said substrate over a small depth, typically in the order of 0.1 mm or less, but without allowing the temperature of the substrate and assembly to exceed ambient temperature (in the order of 15 to 40° C., typically 50° C.).

Implementation of the process according to the invention is at atmospheric pressure. It is understood by this that the pressure to which the substrate is subjected is in the order of 1 atmosphere (100,000 Pa). The process according to the invention thus has the advantage that no vacuum arrangements are necessary.

A plasma is an ionized gas generally obtained by subjecting a so-called plasmagenic gas to an excitation such as a strong DC or alternating electric field, or to thermal or light excitation. Under the action of this excitation, electrons are stripped from the atoms of the gas, and the charged particles thus created migrate towards the oppositely charged electrodes. These charged particles then excite other atoms of the gas by colliding with them, the consequent avalanche effect creating a homogeneous or microfilamentary discharge, or even an arc.

Plasmas can be "hot" (the gas is completely ionized and the temperature is in the order of $10^{6\circ}$ C.) or "thermal" (the gas is almost completely ionized, and the plasma temperature is in the order of $10^{4\circ}$ C., in an electric arc, for example). According to the invention, the plasma is "non-thermal" or "cold": this is a plasma not in thermal equilibrium, in which the gas is very weakly ionized (ion concentration roughly $10^{-2}$ to $10^{-6}$), the temperature of the ions and neutral species being a few tens or hundreds of degrees Celsius, and that of the electrons being several thousand degrees. Taking account of the negligible mass of the electrons, globally the plasma is cold.

Plasmas contain many active species, that is to say, species capable of interacting with matter: ions, electrons or free radicals, the latter having the greatest lifetime in the case of a plasma at atmospheric pressure. The interaction of the active species of a plasma with matter is used industrially to activate, strip, or etch surfaces, or indeed to deposit thin layers. An example of the deposition process making use of these interactions is plasma-enhanced chemical vapor deposition, or PECVD. Here, in the immediate vicinity of a substrate, a zone is created containing active species of a non-thermal plasma, into which is injected at least one gaseous precursor. The PECVD process can be implemented under vacuum or at atmospheric pressure, in which case it is described as APPECVD. This latter process may be used in the process according to the invention.

The active species of the plasma can be generated in immediate proximity with the substrate, for example by positioning the said substrate between two electrodes. The plasma is then described as "in situ". The active species of the plasma may also be generated in an enclosure using an electric field, and then blown out of the said enclosure in the direction of the substrate. One refers in this case to a displaced plasma, which has the advantage of subjecting the substrate to lower temperatures, the plasma density in active species being nevertheless lower than in the case of an in-situ plasma. The displaced plasma is also easier to apply when the thickness of the substrate to be coated is significant.

The plasma can be of low frequency (less than 100 kHz). Plasmas whose frequencies lie in the microwave region (more than 100 kHz) or radio-frequencies may also be used. Plasma power is preferably less than or equal to 100 W/cm$^2$ and/or greater than or equal to 1 μW/cm$^2$, typically 1 mW/cm$^2$.

The plasmagenic gas is preferably an inert gas such as helium, neon, argon or nitrogen or a mixture of inert gases. Nitrogen is particularly preferred on account of its low cost.

The plasmagenic gas can thus also contain (though in small concentration) an oxidizing gas such as oxygen or nitrous oxide. Air may therefore also be used as the plasmagenic gas. Oxidants facilitate precursor decomposition reactions or activation reactions.

Alternatively, the plasmagenic gas may be based on an oxidizing gas such as oxygen.

The, or each, precursor used to deposit the first thin layer is preferably in the form of a gas (if an APPECVD type of process is used), or liquid. In the latter case the precursor is advantageously in the form of microdroplets suspended in the plasmagenic gas. These microdroplets preferably have diameters less than or equal to 1 mm, specifically less than or equal to 0.1 mm.

The, or each, precursor is injected preferably by techniques known to those skilled in the art, employing, for example, a pipe of the type conventionally used in chemical vapor deposition (CVD) processes.

The first thin layer preferably includes silicon and oxygen.

For simplicity, and because silica is an effective protection against radical oxidation reactions, the first thin layer is advantageously based on silicon oxide ($SiO_2$ or $SiO_x$ if the oxide is not perfectly stoichiometric), and indeed entirely $SiO_2$ (or $SiO_x$). Other inorganic materials are nevertheless of interest, such as oxides of aluminum or zirconium, either alone or mixed with silicon oxide.

According to an alternative embodiment, the first thin layer can be a hybrid organic/inorganic layer comprising silicon, oxygen and carbon species covalently bonded to silicon. In this case, the concentration of carbon species preferably decreases linearly within the thickness of the said thin layer from the region closest to the substrate up to the surface of the material. Being more flexible or elastic than purely inorganic layers, hybrid layers have the advantage of adapting themselves better to dimensional variations of the substrate, and therefore of limiting the generation of internal mechanical stresses.

The decreasing carbon concentration gradient within the thickness of the layer from the substrate interface is advantageous in that carbon species at the surface of the layer are liable to degradation by the photocatalytic coating to be deposited onto the first layer; this will give rise to delamination and consequently poor adhesion.

Such hybrid thin layers may be obtained for example by using a silicon precursor containing at least one SiC covalently bonded carbon chain, hexamethyldisiloxane (HMDSO) for example. They may also be obtained by using silicon precursors containing Si—O—C bonds as in tetraethoxysilane (TEOS) or tetramethoxysilane (TMOS), or more generally as in all types of alkoxysilanes, either alone or mixed. The interaction between the precursors and the active species of the non-thermal plasma does not necessarily lead to total fragmentation of the precursors with elimination or the carbon species. Certain alkoxy groups can thus remain bonded to the silicon atoms in the layer, in particular when the plasma power is low and/or when the concentration of oxidant gases in the plasmagenic gas is low. The carbon concentration gradient in the layer may be obtained if necessary by modulating the power of the plasma during deposition, and/or the concentration of oxidant gases in the plasmagenic gas, and/or the flow rate of the precursor.

The thickness of the first thin layer is preferably between 1 nm and 1 μm, specifically between 1 and 100 nm, typically between 5 and 50 nm or between 10 and 20 nm. Such very small thicknesses are shown to be sufficient to provide good protection against radical oxidation reactions, probably on account of the density of the layers obtained by the process according to the invention. On account of being very thin, the layers are perfectly transparent and colorless.

The process according to the invention preferably includes a stage in which a second thin photocatalytic layer is deposited onto the first layer, the former advantageously including titanium dioxide at least partially crystallized in anatase form.

Titanium oxide may be present in this second thin layer in the form of nanoparticles distributed in an inorganic binder, preferably a silicon oxide based binder, specifically obtained by a sol-gel type process. The silicon oxide of the binder may be pure or mixed with other oxides such as oxides of aluminum or zirconium to improve the hydrolytic resistance of the layer.

The inventors have shown that layers obtained according to this embodiment (the sol-gel process) have the advantage of being less sensitive to dimensional variations of the substrate and sub-layer, and are consequently better at resisting the effects of thermal expansion.

The nanoparticles preferably have diameters between 5 and 500 nm, preferably between 10 and 50 nm.

The second thin layer may thus be obtained by hydrolysis and condensation of a sol containing at least one $SiO_2$ precursor (Tetraethoxysilane, or TEOS, for example) and titanium oxide nanoparticles. The layer so obtained may be non-porous, but its porosity may also be adjusted by adding tensioactive agents to the sol so as to create mesopores as taught in patent application WO 03/087002. In the present case, the elimination of structure-forming agents may be brought about at low temperature by means of ultraviolet radiation. Layers comprising a porous (and particularly mesoporous) binder have the advantage of being much more active photocatalytically, but are at the same time more mechanically fragile and exhibit poorer hydrolytic resistance. For external applications, where the material is subject to solar radiation, the low-porosity binders, obtained without addition of structure-forming agents, are shown to have sufficient photocatalytic properties while at the same time exhibiting good hydrolytic resistance. The respective quantities of titanium and silicon in the second layer may be easily controlled. A layer containing a lot of titanium oxide and little silicon oxide binder shows strong photocatalytic activity but also poor hydrolytic resistance. On account of this, the Ti:Si molar ratio in the second layer is preferably between 0.01 and 1, specifically between 0.05 and 0.8, and typically between 0.1 and 0.5.

A layer characterised by a Ti:Si molar ratio of between 0.1 and 0.5 and a non-mesoporous binder is preferred when the material is to be exposed externally. Under these circumstances, the best hydrolytic resistance is required.

The second, photocatalytically active, thin layer, may alternatively be obtained by injecting into the region containing the active species of the non-thermal plasma at least one titanium precursor or titanium oxide nanoparticles.

By comparison with the sol-gel process described earlier, this process has the advantage that it may be carried out, using the same method, immediately after depositing the first thin layer capable of protecting the substrate against radical oxidation reactions. The titanium precursor may be in gas or liquid form, in the latter case being preferably in the form of microdroplets suspended in the plasmagenic gas. These may be halides or alcoholates of titanium such as titanium tetrachloride ($TiCl_4$) or titanium tetraisopropylate (TiPT).

Titanium oxide may advantageously also be added to the second layer by injecting titanium oxide nanoparticles (preferably crystallized in anatase form) into the region containing the plasma active species. In this way the titanium oxide is already crystallized onto the photocatalytic plane in its most active form. Within the framework of this particular embodiment, the two stages of deposition of the first and second layers may be combined into a single stage in which at least one silicon and oxygen precursor and a titanium precursor (or titanium oxide nanoparticles) is injected into the region containing the plasma active species. The concentrations of these two elements are controlled during deposition. At the start of deposition of the single layer, only the silicon and oxygen precursor (TEOS, for example) is injected, giving rise to a layer of silica ($SiO_2$). An increasing quantity of titanium oxide nanoparticles is then added so as to create an increasing concentration gradient of titanium within the thickness of the layer. This method avoids allowing the titanium oxide to come in contact with the substrate, while maximizing the quantity of titanium oxide at the surface where its photocatalytic effect is useful.

The surface of the substrate or material is advantageously subjected to the action of the active species in the non-thermal plasma before deposition of the first thin layer and/or before deposition of the second thin layer, and/or after deposition of the second thin layer.

Before any deposition, activation of the substrate by active species in the plasma allows the creation of hydroxyl groups on the surface of the said substrate, which improves adhesion of the first layer to the substrate.

It has been observed that the same type of activation after deposition of the first layer renders the surface of this layer more hydrophilic, and further improves adhesion between the first and second layer. In this case of a first layer of silica, water contact angles less than 20°, typically 10°, may be achieved thanks to this second activation stage.

Such activation after deposition of the second layer allows densification of the said second layer (in particular when obtained by a sol-gel process), leading to an increase in mechanical strength and hydrolytic resistance.

For these different activation stages the plasmagenic gas is not necessarily that used in the deposition of the layers. In particular, the use of oxygen ($O_2$) for the plasmagenic gas is preferred for at least one of the activation stages, although nitrogen ($N_2$) has been shown to be particularly effective in layer deposition.

An object of the invention is also a material obtainable by the process according to the invention, and in particular architectural elements such as windows, shutters, walls, claddings, pool surrounds, garden furniture or gates embodying such a material.

A further object of the invention is the use of the material according to the invention utilizing its self-cleaning capacity and/or its ability to resist soiling and/or to be easily cleaned. These different technical features are obtained cumulatively or alternately by the layers deposited according to the invention, on account of the photo-induced hydrophilic properties of titanium oxide, or of the hydrophilic properties of the barrier layer, in particular when comprising a layer based on or containing silicon oxide.

The invention will be better understood in the light of the following examples (but not limited to them).

Example 1

A white PVC substrate is placed under a displaced plasma source in order to proceed to deposition of a layer of silica. The plasma has a power of 1350 W and is created in the source enclosure using a plasmagenic gas being a mixture of nitrogen (flow rate 200 standard liters/min) and oxygen (0.5 standard liters/min), and which is then blown out of the enclosure via a slit 12 mm long by 2 mm wide towards the substrate drawn below the source. Thus a region containing the active species is created above and in immediate proximity to the substrate. Using a tube, gaseous tetraethoxysilane at 80° C. mixed with nitrogen (flow rate 2 standard liters/min) is injected into this region. This silica precursor is decomposed by the action of active species, and is deposited in the form of a thin layer of silica ($SiO_2$) roughly 20 nm thick.

On top of this first barrier layer is then deposited a second layer based on $TiO_2$ nanoparticles dispersed in a silica binder. To do this, a mixture of tetraethoxysilane (TEOS) is mixed with ethanol and water acidulated to a pH of 1.25 in a molar ratio of 1:5:3.8. The whole assembly is heated for 1 hour at 60° C., and then diluted in a double volume of ethanol. $TiO_2$ nanoparticles are then added so as to obtain a Ti:Si molar ratio close to 0.5.

The sol thus obtained is deposited onto the PVC substrate which has already been coated with its first layer by a dip-coating technique so as to obtain a second layer with photocatalytic properties. Spray-coating or roll-coating techniques may also be used by means of adjustment of choice of solvents and sol concentration, such adjustments being well known to those skilled in the art.

The degree of adhesion of the second layer is tested by means of adhesive tape corresponding to standard NF ISO 9211-4. No lifting of the layers is detected.

The material obtained demonstrates superhydrophilic characteristics after 24 hours of UVA type ultraviolet radiation. After 12 months of exposure in the open air (northern exposure), the material according to the invention showed only a very few surface stains or blemishes, while a sample of non-treated PVC (not coated with any layers) was extremely soiled. Moreover, those few blemishes which had been deposited on the material according to the invention were completely removed simply by spraying with water. This was not the case with blemishes deposited on the non-treated PVC.

Example 2

Comparative

This comparative example is similar to that of Example 1, the sole difference being that the $SiO_2$ barrier was obtained by a sol-gel type of process using TEOS, and not by an APPECVD type of process.

Adhesion of the second layer to the barrier layer was poor since the adhesion test according to standard NF ISO 9211-4 led to delamination of the second layer. It was even possible to observe detachment of the photocatalytic layer the moment it was deposited onto the barrier layer.

Barrier layers obtained by the process according to the invention consequently demonstrate an improved adhesion with the second layer by comparison with those barrier layers obtained using the processes of prior art.

Example 3

This example differs from Example 1 in that the second layer was not deposited. The material thus comprises PVC coated by a layer of $SiO_2$ obtained in accordance with the invention.

After 12 months outdoors, the surface of the material was significantly less soiled than that of a non-treated PVC sample. The blemishes which were deposited were easily removed using a jet of water, in contrast with the blemishes deposited on the non-treated PVC. The material according to the invention thus has the advantage of being less easily soiled and of being easily cleaned. These advantages are nonetheless less pronounced than those in Example 1, where a photocatalytic coat was additionally deposited.

The hydrolytic resistance of the layer thus obtained was excellent.

Example 4

Comparative

This example differs from that of Example 1 in that the first barrier layer was not deposited. The $TiO_2$ based photocatalytic layer was in direct contact with the PVC.

The durability of the layers thus obtained is very poor, and in particular, the layers thus obtained easily detached from the PVC substrate after a few weeks of exposure. This was due to the PVC being attacked by radical oxidation reactions catalysed by the titanium oxide.

Examples 5 and 6

Examples 5 and 6 differ from that of Example 1 in the Ti:Si ratio, and in that the binder of the second layer is of a mesoporous type.

To obtain a mesoporous binder, tetraethoxysilane (TEOS), ethanol and water acidulated to a pH of 1.25 are mixed in a molar ratio of 1:5:3.8. The whole assembly is heated for 1 hour at 60° C. and then diluted in a double volume of ethanol containing a structure-forming agent. This agent is a polyoxyethylene-polyoxypropylene copolymer marketed by BASF under the trade-name Pluronic PE6800 (molar mass 8000) and in proportions such that the molar ratio PE6800:Si is 0.01. $TiO_2$ nanoparticles are then added so as to obtain a Ti:Si molar ratio of 1 (Example 5) and 0.1 (Example 6). Strictly speaking, deposition is then carried out as in Example 1 and the structure-forming agent is eliminated under UV radiation on account of the photocatalytic action of the titanium oxide.

Adhesion between the barrier layer and the second layer is satisfactory.

Photocatalytic activity of the layer containing the least amount of $TiO_2$ (Example 6) is similar to that obtained in Example 1, in spite of a five-fold decrease in the quantity of $TiO_2$. This demonstrates the influence of the porous characteristics of the binder. Photocatalytic activity of the material according to Example 5 is much greater.

Hydrolytic resistance of the layers after accelerated ageing according to Standard ASTM G155 is better in the case of Example 6 than in Example 5, but does not approach that obtained in Example 1, where the binder is non-porous.

After an exposure of 12 months outdoors, the materials according to examples 5 and 6 were perfectly clean.

The invention claimed is:

1. A process whereby a material obtained comprising a substrate of which at least a part of the surface of at least one of the faces of the substrate is based on organic compounds, said process being implemented at atmospheric pressure and without heating the totality of said substrate, said process comprising moreover the following stages:

In immediate proximity to said substrate creating a region containing active species of a non-thermal plasma, Into said region injecting at least one precursor of a chemical element so as to deposit onto at least one face of said substrate, at least one part of the surface being based on organic compounds, a first thin layer able to protect said substrate against oxidation reactions due to radicals, said at least one precursor being selected to provide a first thin layer comprising silicon and oxygen, and subsequently depositing a second thin layer with photocatalytic properties onto the first thin layer.

2. A process according to claim 1 such that the active species of the non-thermal plasma are generated in immediate proximity to the substrate by positioning said substrate between two electrodes, or are generated in an enclosure by means of an electric field before being blown out of said enclosure in the direction of said substrate.

3. A process according to claim 1 such that the plasma is generated from an inert gas selected from the group consisting of helium, neon, argon, nitrogen, and mixtures of inert gases.

4. A process according to claim 3, such that the inert gas also contains a small proportion of an oxidant gas.

5. A process according to claim 1, such that the at least one precursor is in the form of a gas or a liquid.

6. A process according to claim 1, such that the first thin layer is a hybrid organic/inorganic layer comprising silicon, oxygen and carbon species covalently bonded to silicon, the concentration of carbon species decreasing linearly within the thickness of the said thin layer from the region nearest the substrate up to the surface of the material.

7. A process according to claim 1, such that the thickness of the first thin layer is between 1 nm and 1 micrometer.

8. A process according to claim 1, such that the thin layer with photocatalytic properties includes titanium oxide at least partially crystallized in anatase form.

9. A process according to claim 8, such that the titanium oxide is present in the form of nanoparticles distributed in an inorganic binder.

10. A process according to claim 9, such that the inorganic binder is based on silicon oxide, the silicon oxide based binder being obtained by a sol-gel process.

11. A process according to claim 1, such that the second thin layer with photocatalytic properties is obtained by injecting into the region containing the active species of the non-thermal plasma at least one material selected from the group consisting of gaseous titanium precursor, liquid titanium precursor, and nanoparticles of titanium oxide.

12. A process according to claim 11 such that the surface of the substrate is subjected to the action of active species of the non-thermal plasma before deposition of the second thin layer.

13. A process according to claim 11 such the surface of the substrate is subject to the action of active species of the non-thermal plasma after deposition of the second thin layer.

14. A process according to claim 1, such that the surface of the substrate is subjected to the action of active species of the non-thermal plasma before deposition of the first thin layer.

15. A process according to claim 1, such that the substrate is chosen from substrates of polyvinylchloride (PVC), polyethylene, polypropylene, painted wood, or painted aluminum.

16. A process whereby a material obtained comprising a substrate of which at least a part of the surface of at least one of the faces of the substrate is based on organic compounds, said process being implemented at atmospheric pressure and without heating the totality of said substrate, said process comprising moreover the following stages:

In immediate proximity to said substrate creating a region containing active species of a non-thermal plasma, Into said region injecting at least one precursor of a chemical element so as to deposit onto at least one face of said substrate, at least one part of the surface being based on organic compounds, a first thin layer able to protect said substrate against oxidation reactions due to radicals, the first thin layer being deposited such that the first thin layer comprises a hybrid organic/inorganic layer comprising silicon, oxygen and carbon species covalently bonded to silicon, the concentration of carbon species decreasing linearly within the thickness of the said thin layer from the region nearest the substrate up to the surface of the material.

17. A process of claim 16 further comprising subsequently depositing a second thin layer with photocatalytic properties onto the first thin layer.

18. A process according to claim 17, such that the thin layer with photocatalytic properties includes titanium oxide at least partially crystallized in anatase form.

19. A process according to claim 18, such that the titanium oxide is present in the form of nanoparticles distributed in an inorganic binder based on silicon oxide, the silicon oxide based binder being obtained by a sol-gel process.

20. A process according to claim 17, such that the second thin layer with photocatalytic properties is obtained by injecting into the region containing the active species of the non-thermal plasma at least one material selected from the group consisting of gaseous titanium precursor, liquid titanium precursor, and nanoparticles of titanium oxide.

21. A process whereby a material obtained comprising a substrate of which at least a part of the surface of at least one of the faces of the substrate is based on organic compounds, said process being implemented at atmospheric pressure and without heating the totality of said substrate, said process comprising moreover the following stages:

In immediate proximity to said substrate creating a region containing active species of a non-thermal plasma, Into said region injecting at least one precursor of a chemical element so as to deposit onto at least one face of said substrate, at least one part of the surface being based on organic compounds, a first thin layer able to protect said substrate against oxidation reactions due to radicals, said at least one precursor being selected to provide a first thin layer comprising silicon and oxygen, subsequently depositing a second thin layer with photocatalytic properties onto the first thin layer; and subjecting the surface of the substrate to the action of active species of the non-thermal plasma before deposition of the second thin layer.

\* \* \* \* \*